US010930825B2

(12) United States Patent
Bohmer et al.

(10) Patent No.: US 10,930,825 B2
(45) Date of Patent: Feb. 23, 2021

(54) TWO STEP PHOSPHOR DEPOSITION TO MAKE A MATRIX ARRAY

(71) Applicant: Lumileds Holding B.V., Schiphol (NL)

(72) Inventors: Marcel Rene Bohmer, Eindhoven (NL); Jacques Heuts, Eindhoven (NL); Ken Shimizu, San Jose, CA (US); Peter Schmidt, Aachen (DE)

(73) Assignee: Lumileds LLC, San Jose, CA (US)

( * ) Notice: Subject to any disclaimer, the term of this patent is extended or adjusted under 35 U.S.C. 154(b) by 41 days.

(21) Appl. No.: 16/232,884

(22) Filed: Dec. 26, 2018

(65) Prior Publication Data

US 2020/0212270 A1 Jul. 2, 2020

(51) Int. Cl.
*H01L 33/50* (2010.01)
*H01L 25/075* (2006.01)
*H01L 33/60* (2010.01)

(52) U.S. Cl.
CPC ........ *H01L 33/507* (2013.01); *H01L 25/0753* (2013.01); *H01L 33/60* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS 10,431,717 B1 * 10/2019 Dasgupta ............ H01L 27/156
2017/0200765 A1 7/2017 Choi et al.

FOREIGN PATENT DOCUMENTS

WO 95/30236 A1 11/1995
WO 2018/122520 A1 7/2018

OTHER PUBLICATIONS

European Search Report corresponding to EP19154680, dated Jun. 6, 2019, 1 page.
International Search Report from the EPO as the ISA, PCT/EP2019/085595, dated Feb. 6, 2020, 3 pages.
Written Opinion from the EPO as the ISA, PCT/EP2019/085595, dated Feb. 6, 2020, 6 pages.

* cited by examiner

*Primary Examiner* — Michelle Mandala

(57) ABSTRACT

A method of fabricating closely spaced pcLEDs arranged in a matrix array of perpendicular rows and columns comprises an initial phosphor deposition step in which phosphor is deposited at alternating locations (pixels) in the matrix array in a checkerboard pattern, so that the locations in the array at which phosphor is deposited are not adjacent to each other. In a subsequent phosphor deposition step phosphor is deposited at the alternating locations at which phosphor was not deposited in the first deposition step. In between the two phosphor deposition steps, reflective or scattering structures may be fabricated on sidewalls of the phosphor pixels to optically isolate pcLEDs in the resulting array from each other.

20 Claims, 9 Drawing Sheets

TWO STEP PHOSPHOR DEPOSITION TO MAKE A MATRIX ARRAY

FIELD OF THE INVENTION

The invention relates generally to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

This specification discloses methods for fabricating closely spaced pcLEDs arranged in a matrix array of perpendicular rows and columns. The phosphor may be deposited directly on the array of LEDs. Alternatively the phosphor may be deposited on a carrier substrate in a matrix array corresponding to the array of LEDs and later transferred to the LEDs.

In either case in an initial phosphor deposition step phosphor is deposited at alternating locations (pixels) in the matrix array in a checkerboard pattern, so that the locations in the array at which phosphor is deposited are not adjacent to each other. Phosphor is deposited at half, or about half, of the locations in the array in this first step. In a subsequent phosphor deposition step phosphor is deposited at the alternating locations at which phosphor was not deposited in the first deposition step. In between the two phosphor deposition steps, reflective structures may be fabricated on side walls of the phosphor pixels to optically isolate pcLEDs in the resulting array from each other.

An advantage of this method is that there are typically no high aspect ratio structures in the matrix array when the reflective structures are deposited, which facilitates their deposition. Another advantage is that the spacing between the pixels is equal to the reflector thickness, which may be very thin. The reflector thickness may be, for example, less than or equal to about 10 microns, less than or equal to about 5 microns, less than or equal to about 3 microns, or less than or equal to about 0.2 microns.

Phosphor-converted LEDs fabricated by the methods disclosed herein may be employed for example in microLED arrays used in displays, in LED arrays used for illumination in automobiles (for example, in headlights), and in flash light sources for cameras.

Other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
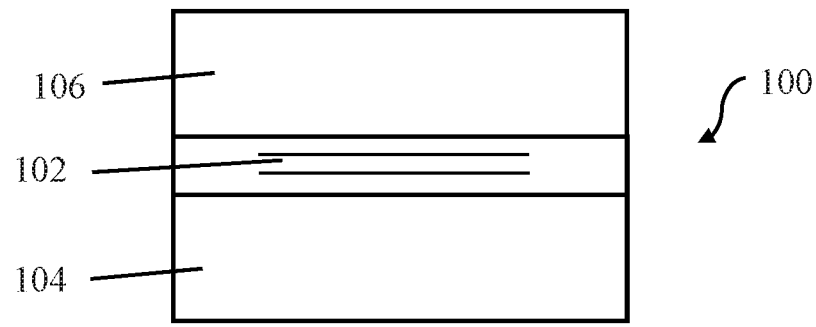
FIG. 1 shows a schematic cross-sectional view of an example pcLED.

FIG. 1 shows an example of an individual pcLED 100 comprising a semiconductor diode structure 102 disposed on a substrate 104, together considered herein an "LED", and a phosphor layer 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
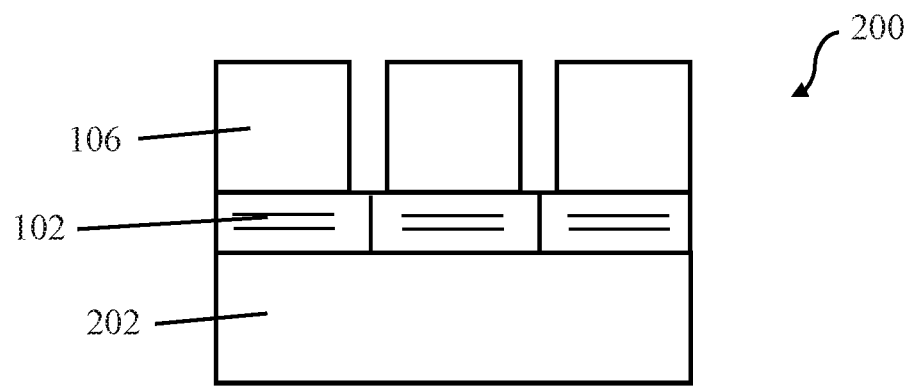
FIGS. 2A and 2B show, respectively, cross-sectional and top schematic views of an array of pcLEDs.
Figure 2B:
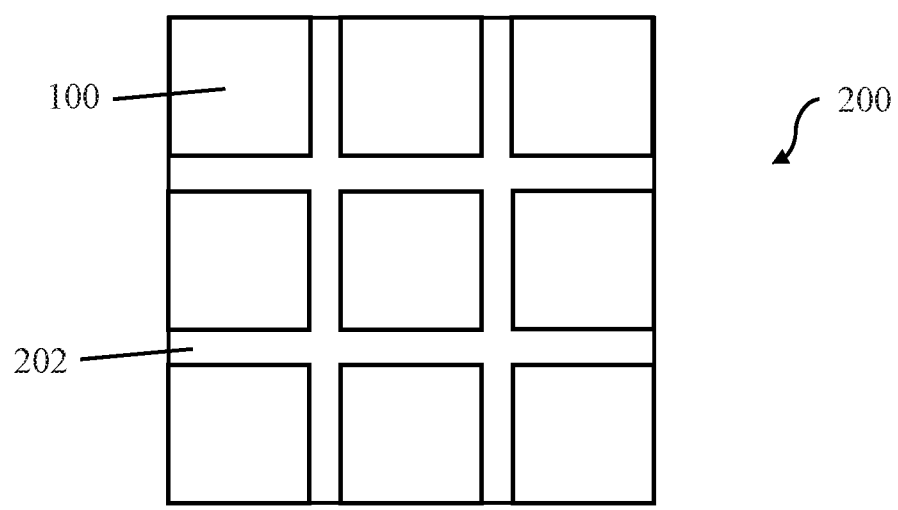

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Figure 3A:
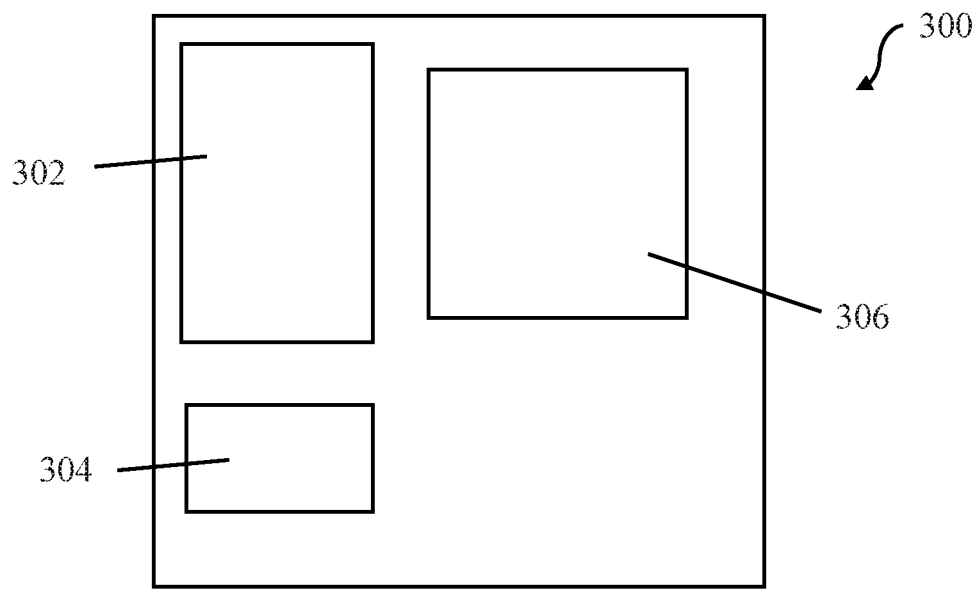
FIG. 3A shows a schematic top view an electronics board on which an array of pcLEDs may be mounted, and FIG. 3B similarly shows an array of pcLEDs mounted on the electronic board of FIG. 3A.
Figure 3B:
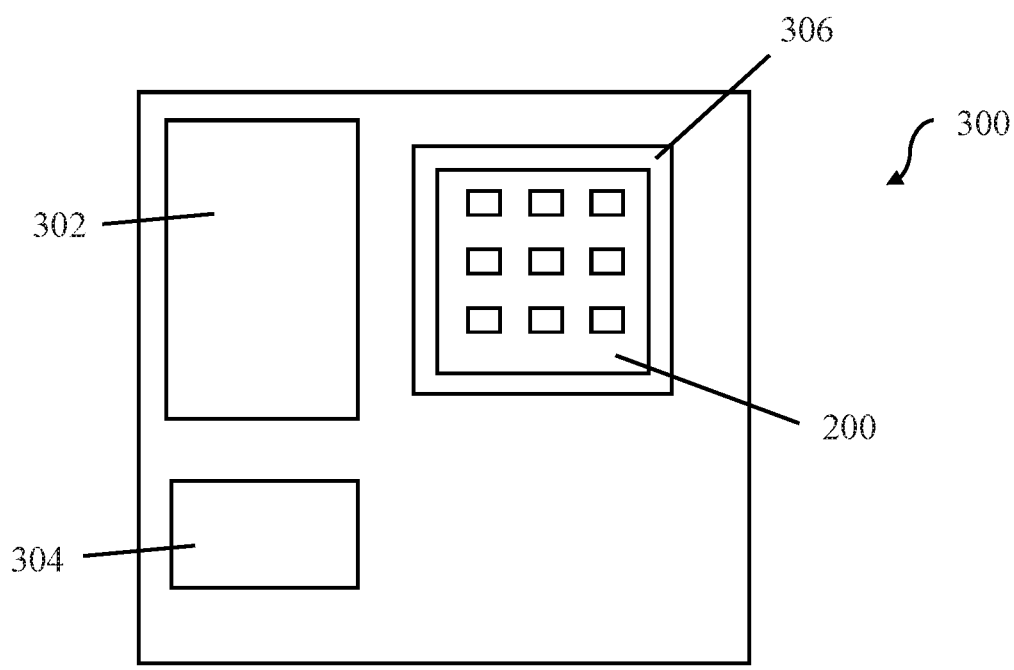

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
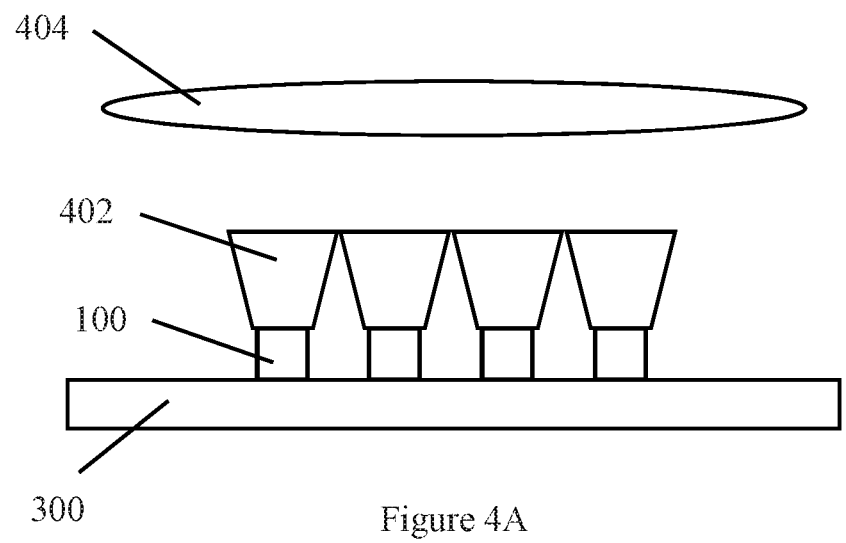
FIG. 4A shows a schematic cross sectional view of an array of pcLEDs arranged with respect to waveguides and a projection lens.
Figure 4B:
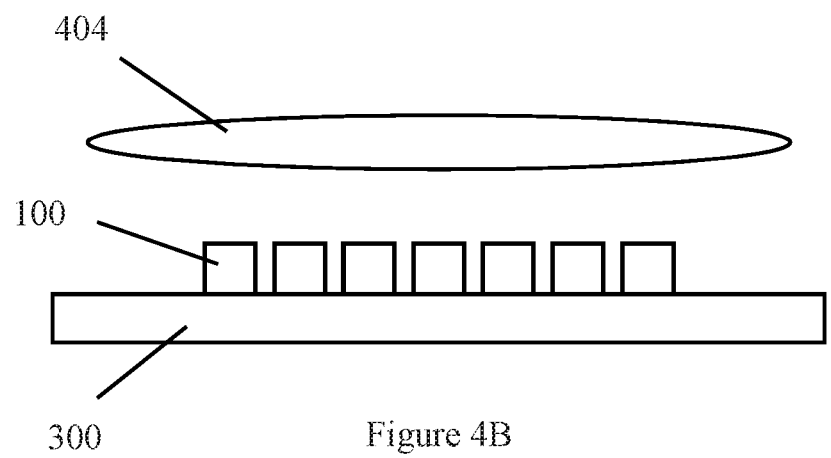
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

For many uses of pcLED arrays, it is desirable to compartmentalize the light emitted from the individual pcLEDs in the array. That is, it is advantageous to be able to operate an individual pcLED in the array as a light source while adjacent pcLEDs in the array remain dark. This allows for better control of displays or of illumination.

It is also advantageous in many applications to place the pcLEDs in the array close together. For example, a preferred configuration in microLEDs is to have minimal spacing between the individual LEDs. Closely spacing the pcLEDs in an array used as a camera flash light source or in an automobile headlight may simplify the requirements on any secondary optics and improve the illumination provided by the array.

However, if pcLEDs in an array are placed close together, optical cross talk between adjacent pcLEDs may occur. That is, light emitted by a pcLED may scatter into or otherwise couple into an adjacent pcLED and appear to originate from that other pcLED, preventing the desired compartmentalization of light.

The possibility of optical crosstalk between pixels in an array prohibits the use of a single shared phosphor layer on top an array of LEDs. Instead, patterned phosphor deposition providing a discrete pixel of phosphor on each light emitting element is needed, in combination with reflecting sidewalls on the phosphor pixels.

If the spacing between the LEDs in the array is small, for instance smaller than 10 or 20 microns, it is difficult to form reflecting side walls on the phosphor pixels with wet chemical or physical deposition methods due to the high aspect ratios of the channels to be filled or coated. The most common scattering layer used as a side coat for LEDs comprises $TiO_2$ scattering particles embedded in silicone. Another option is a reflective metal layer, such as for instance aluminum or silver. Yet another option is a multi-layer Distributed Bragg Reflector (DBR) structure formed from a stack of alternating layers of high and low refractive index material, which can provide very high reflectance depending on design. To ensure uniform coating of such reflective layers or structures on the side walls of the phosphor pixels, the side walls should be accessible. If the aspect ratio of the gap between adjacent phosphor pixels is high, inhomogeneities in the reflective coating thickness can be expected leading to non-uniform, non-optimal reflecting properties.

This specification discloses a method of coating the side walls of phosphor pixels that may be employed to produce a pcLED array with very close spacing of adjacent pcLEDs. As summarized above, in a first phosphor deposition step only half (or about half) of the phosphor pixels are deposited, in a checkerboard pattern. For example, for a matrix array having an even number of pixels half of the phosphor pixels may be deposited in the first phosphor deposition step. For a matrix array having an odd number of pixels half plus or minus 1 of the phosphor pixels may be deposited in the first phosphor deposition step. After the first phosphor deposition step (and removal of any patterned structures or molds used in the first deposition step) the reflecting side coats are deposited. At this stage in the method no high aspect ratio structures are present in the system to interfere with deposition of the reflecting side coats. In a following step the remaining phosphor pixels are deposited, leading to a pixelated matrix array of phosphor pixels each with reflecting side coats.

Figure 5:
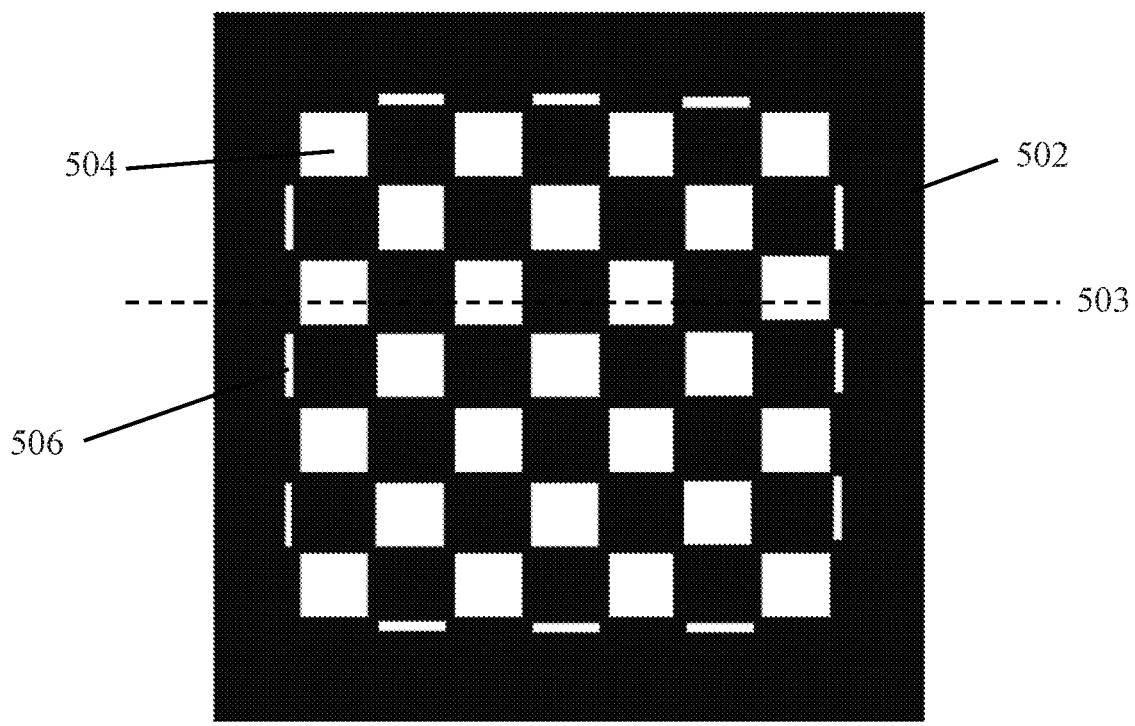
FIG. 5 shows a schematic top view of an example checkerboard patterned structure that may be employed in phosphor deposition methods described herein.

FIG. 5 shows a top view of an example 7×7 checkerboard pattern structure 502 that may be used in this method. As further described below, structure 502 may be formed, for example, from a photoresist or as an optionally reusable mold. Similar larger or smaller M×N structures may be employed, in which M and N may be equal or may be different. Structure 502 comprises rectangular (e.g., square) openings 504 alternating with rectangular (e.g., square) features of the structure to form the checkerboard pattern. These rectangular features of structure 502 may be blocks of photoresist or portions of a mold, for example. Structure 502 further comprises thin rectangular openings 506 arranged around the edge of the checkerboard pattern adjacent to outer ones of the rectangular features in the structure.

As further described below, openings 504 are used to form phosphor pixels in the first phosphor deposition step. The function of openings 506 is to provide, after the first phosphor deposition step, a surface onto which a mirror structure can be deposited. Otherwise the outer pixels formed during the second phosphor deposition step described below would lack an outer mirror structure. Phosphor deposited in openings 506 is not used for light generation.

As an example, square openings 504 in structure 502 may be 200 microns in width, and thin rectangular openings 506 may be 200 microns in length and 50 microns in width. The rectangular features in the checkerboard pattern of structure 502 are wider and longer than openings 504 by twice the width of the reflective side coatings to be deposited on the pixelated phosphor array, in this example about two times 10 microns. The resulting pixel size and spacing may be suitable for a flash module, for example. Smaller sizes may easily be created, for example 32×32 micron pixels with 8 micron streets (pixel spacing, reflector width), 35×35 micron pixels with 5 micron streets, and 37×37 micron pixels with 3 micron streets. Larger pixel sizes may be used as well. Any other suitable dimensions may be used.

Figure 6A:
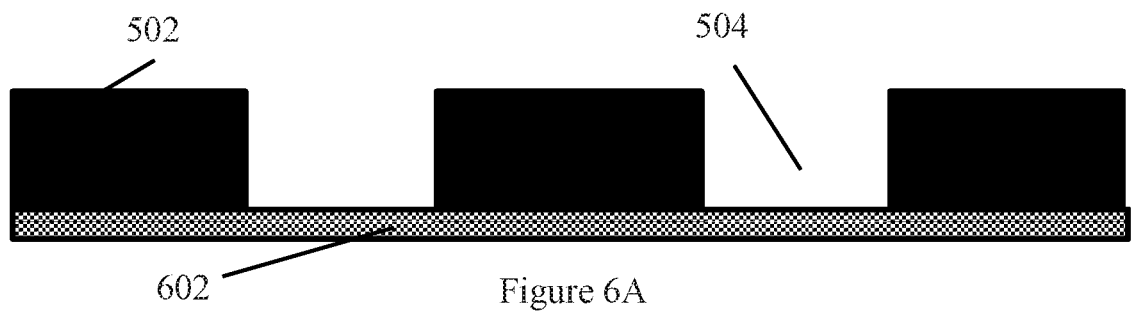
FIGS. 6A, 6B, 6C, 6D, 6E, 6F, 6G, 6H, and 6I illustrate intermediate stages in the fabrication of a pcLED array by one variation of the phosphor deposition methods described herein.

FIGS. 6A-6I show a partial cross-sectional view of structure 502 taken along cut line 503 shown in FIG. 5. Referring now to these figures, in one variation of this method checkerboard pattern 502 is formed from photoresist deposited on a carrier 602 (FIG. 6A). Any suitable photoresist may be used, and the photoresist may be patterned using any suitable conventional methods. Carrier 602 may be for example a glass sheet, or any other suitable material.

Figure 6B:
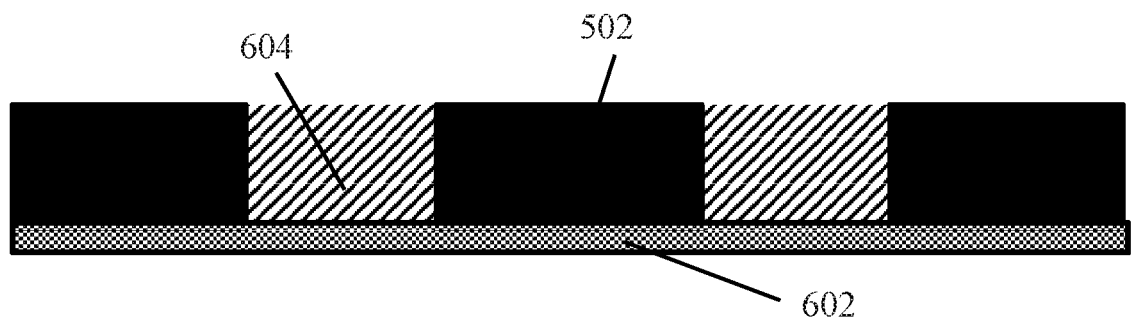

Subsequently, as shown in FIG. 6B, openings 504 in structure 502 are filled with phosphor material to form phosphor pixels 604. Thin rectangular openings 506 in structure 502 are also filled with phosphor material at this step. The phosphor material may comprise, for example, any suitable phosphor particles dispersed in any suitable matrix material. Suitable matrix materials may include, for example, silicones, sol gels, and low melting point glasses. The phosphor pixels may be deposited by any suitable method, for instance by blade coating or by spray coating. Excess phosphor material may be removed from the top of structure 502 by, for example, rinsing or wiping or a combination of the two. Phosphor pixels 604 may then be cured or partially cured to such an extent that the photoresist forming structure 502 may be stripped without affecting the phosphor layer.

Figure 6C:
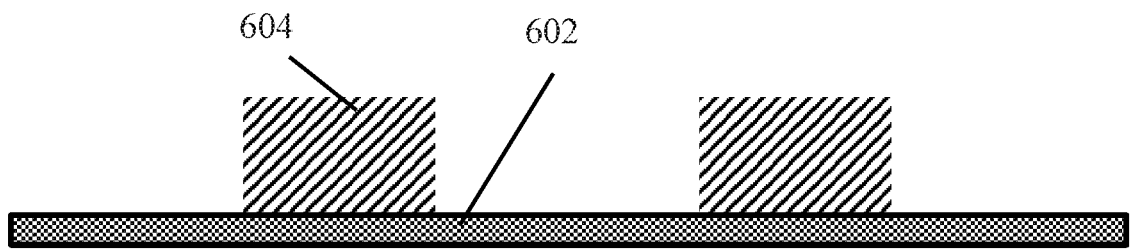

Subsequently, as shown in FIG. 6C, the photoresist forming structure 502 is stripped from carrier 602, leaving phosphor pixels 604 with their side walls exposed. The photoresist may be stripped with a solvent or by dry etching, for example, or by any other suitable method.

Optionally, after stripping of the photoresist the phosphor matrix can be cured further. Also optionally, to arrest metal migration or to improve adhesion of a reflecting layer on the phosphor pixels, intermediate layers may be deposited on the phosphor pixels or the phosphor pixels may be treated with a plasma or exposed to UV/Ozone.

Figure 6D:
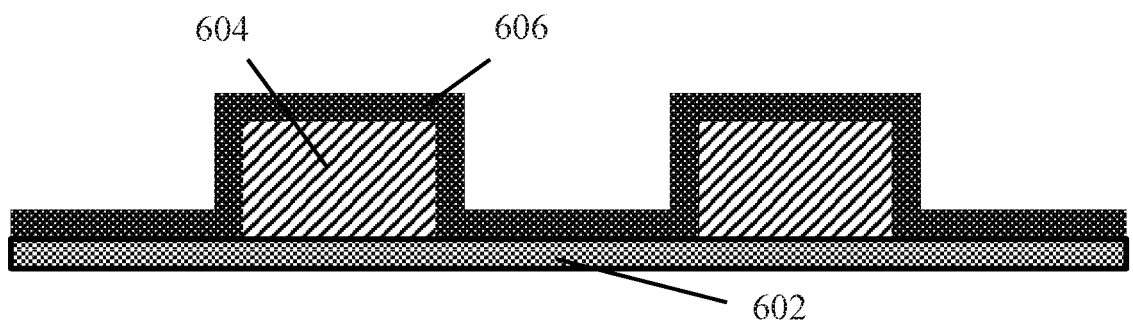

Subsequently, as shown in FIG. 6D, a reflecting layer 606 may be deposited on the top and the side walls of phosphor pixels 604. Advantageously, at this stage the side walls of pixels 604 are easily accessed because the neighboring phosphor pixels have not yet been deposited. Reflecting layer 606 may be or comprise, for example, a light scattering material such as $TiO_2$ particles embedded in silicone, one or more reflective metal layers, or one or more DBR structures. Reflective metal layers may be deposited by vapor deposition or sputtering, for example. DBR structures may be deposited by atomic layer deposition, for example.

Reflective layer 606 may have a thickness on side walls of phosphor pixels 604 of, for example less than or equal to about 0.2 microns, less than or equal to about 3 microns, less than or equal to about 5 microns, less than or equal to about 10 microns, or less than or equal to about 20 microns. An aluminum mirror reflective structure may have a thickness less than or equal to about 0.2 microns, for example. A DBR structure may have a thickness of less than or equal to about 3 microns, for example. In the final phosphor array structure, the thickness of these reflector sidewalls is also the spacing between phosphor pixels.

Figure 6E:
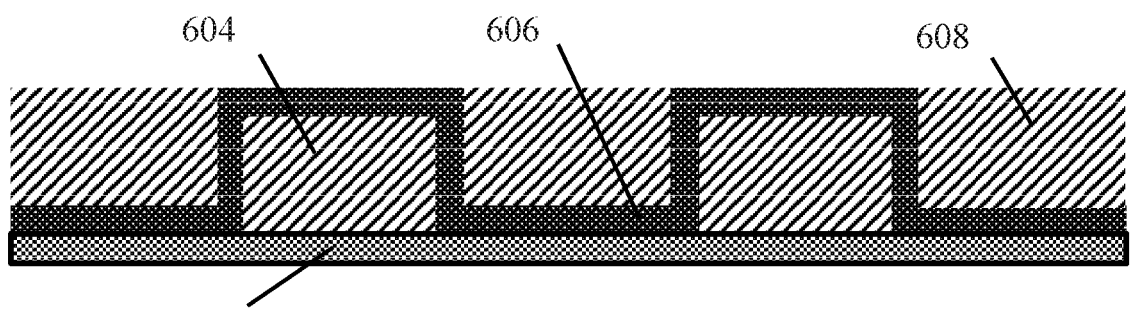

Subsequently, as shown in FIG. 6E, after deposition of reflecting layer 606, a second phosphor layer application step is carried out to deposit phosphor pixels 608. Phosphor pixels 608 are located where the rectangular features in the checkerboard pattern of structure 502 (shown in FIG. 5) were previously located. The phosphor structures formed by filling thin rectangular openings 506 in the previous phosphor deposition step prevent phosphor material deposited in the second phosphor deposition step from flowing out of the array.

The phosphor material deposited in the second deposition step to form pixels 608 may be the same as that deposited in the first deposition step to form pixels, 604. Alternatively, the phosphor materials used in the two separate deposition steps may differ. For example, the phosphor materials use in the two steps may comprise the same phosphors, and hence have the same or similar spectral characteristics, but differ in the matrix material in which the phosphor particles are dispersed. Alternatively, the phosphor materials used in the two different deposition steps may use the same matrix material but comprise different phosphors having different spectral characteristics. For example, in one of the deposition steps a phosphor providing a warm white light output may be deposited while in the other phosphor deposition step a phosphor providing a cool white light output may be deposited. This would result in a matrix with about half warm white pixels and about half cool white pixels, which might be advantageously employed in a camera flash application for example. The phosphor materials used in the two separate deposition steps may also differ in both matrix and phosphor.

Figure 6F:
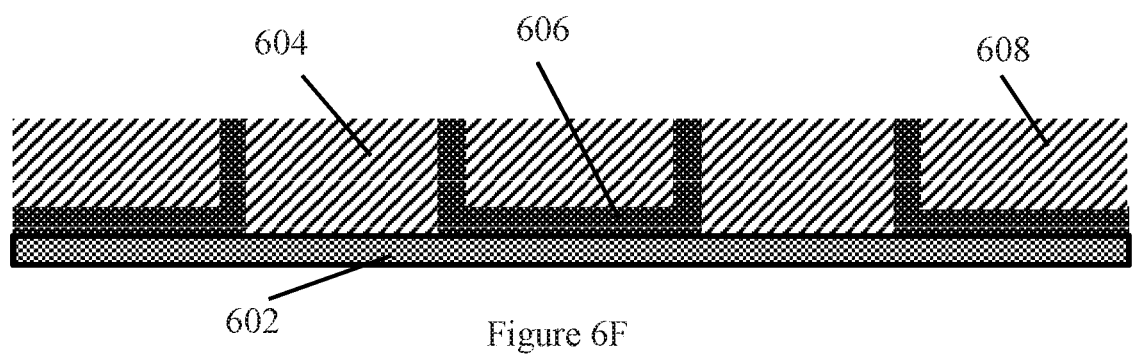

After the second phosphor deposition step, the portion of the reflective layers on top of phosphor pixels 604 are removed by chemical or mechanical means, for example, resulting in the phosphor pixel array shown in FIG. 6F.

Figure 6G:
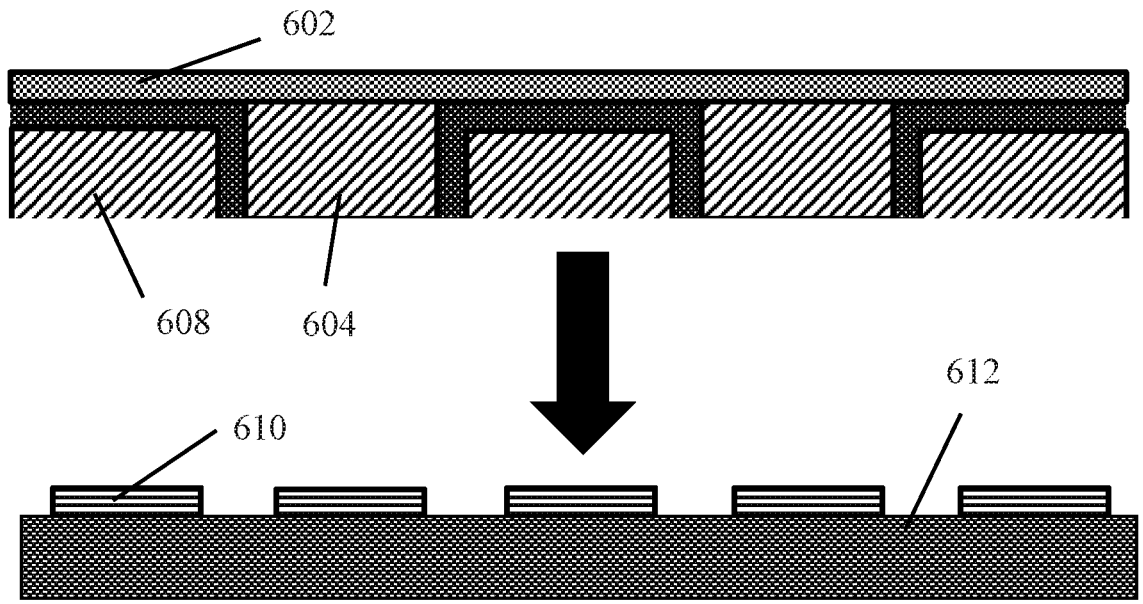
Figure 6H:
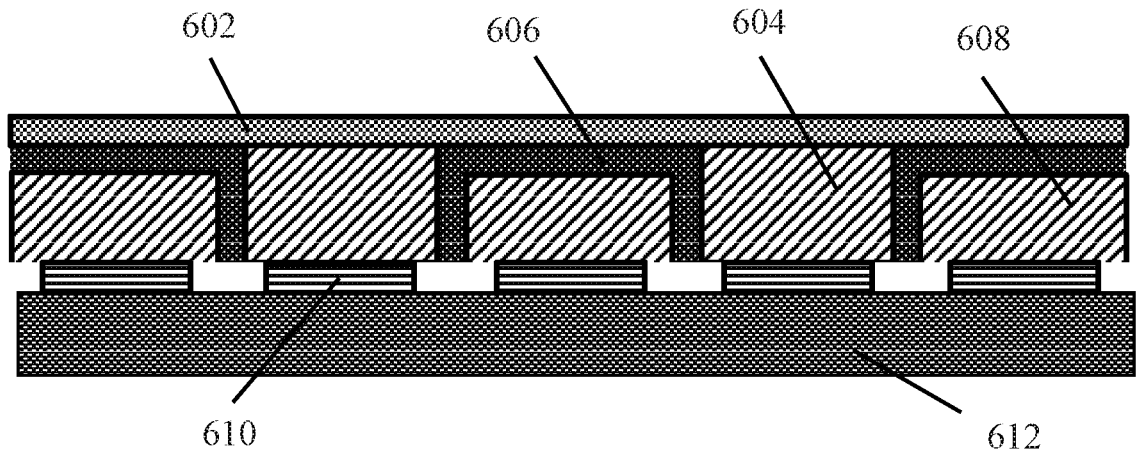
Figure 6I:
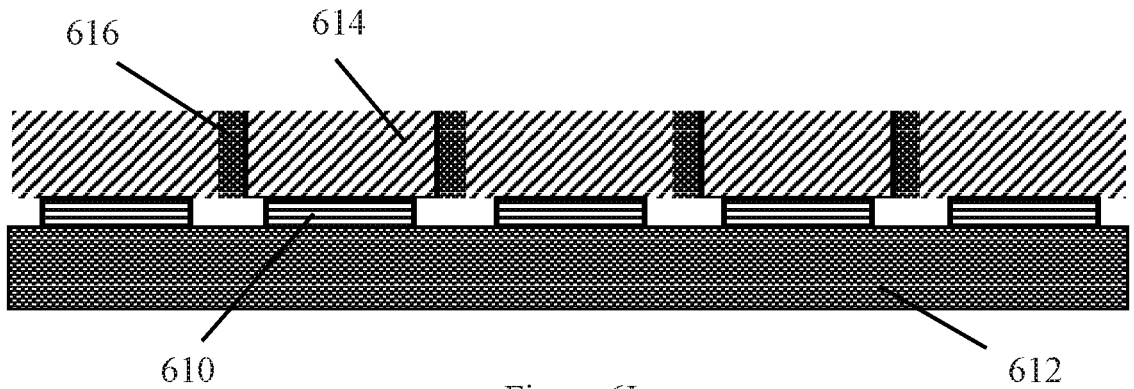

As shown in FIG. 6G, the phosphor pixel array shown in FIG. 6F may be inverted and bonded to an array of LEDs 610 arranged on a substrate 612, with the phosphor pixels aligned with corresponding LEDs. This results in the structure shown in FIG. 6H.

Subsequently, carrier 602 and portions of reflective layer 606 present on carrier 602 are removed by polishing or grinding (lapping). This results in the pcLED array shown in FIG. 6I, in which adjacent closely spaced phosphor pixels 614 are separated by reflective side walls 616.

Figure 7A:
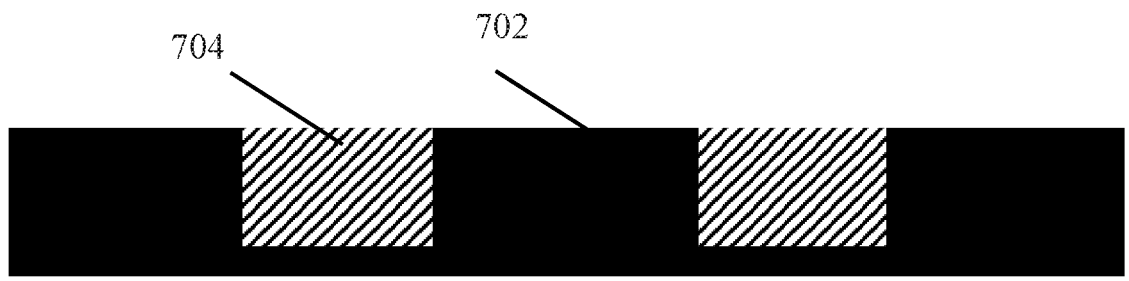
FIGS. 7A, 7B, 7C, and 7D illustrate intermediate stages in the fabrication of a pcLED array by another variation of the phosphor deposition methods described herein.

Referring now to the partial cross-sectional views shown in FIGS. 7A-7D, in another variation of the phosphor deposition method an optionally reusable mold 702 having openings as shown in FIG. 5, for example, is used instead of a photoresist pattern. Openings in the mold are filled with a phosphor material to form phosphor pixels 704, and excess phosphor is removed from the top surface of the mold (FIG. 7A).

The mold may be formed from boron-nitride, for example, and may be used for example in combination with phosphor materials that cure at a higher temperature than photoresists can withstand. The phosphor material may be, for example, a phosphor in glass (PiG) material. Any other suitable phosphor materials may be used instead. For example, the phosphor material may comprise a silicone or sol-gel matrix as described above, rather than a glass matrix.

Figure 7B:
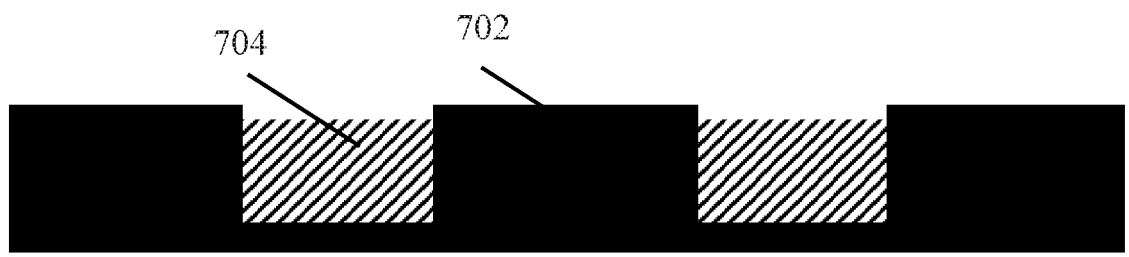

Subsequently, phosphor pixels 704 are cured. For a PiG material, phosphor pixels 704 may be cured at about 480° C., for example. The phosphor material may but will not necessarily shrink during curing, as depicted in FIG. 7B. This might be compensated for by over-filling the mold (see for example FIG. 8A discussed below).

Figure 7C:
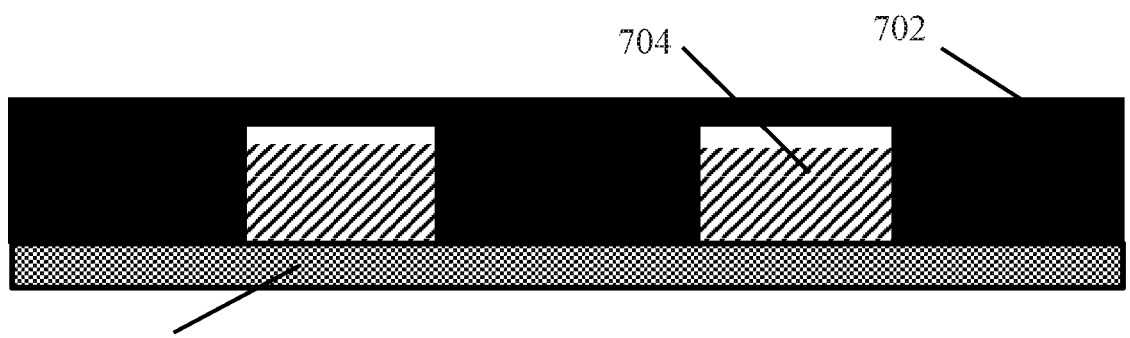

Subsequently, the mold is inverted on a carrier 706 (FIG. 7C), and the mold is removed after a further heating step that softens the phosphor material to attach and leave phosphor pixels 704 on the substrate after cooling and removal of the mold. The carrier may be a glass sheet, for example, or any other suitable material. If the phosphor material has shrunk as depicted in FIG. 7B-7C, it might be difficult to get it to release from the mold.

Alternatively, the phosphor material, a PiG material for example, is deposited in the voids of the mold. Before curing the phosphor material, the substrate 706 is attached to the mold and the mold and substrate assembly is flipped to a configuration as shown in FIG. 7C followed by a high temperature curing step. The high temperature curing step, carried out at about 480° C. for example, may be done under reduced pressure to improve the density of the phosphor pixels 704 and the adhesion to the substrate 706.

Subsequent steps in forming the pcLED array in this variation of the method may generally track those described with respect to FIGS. 6D-6I.

Figure 8A:
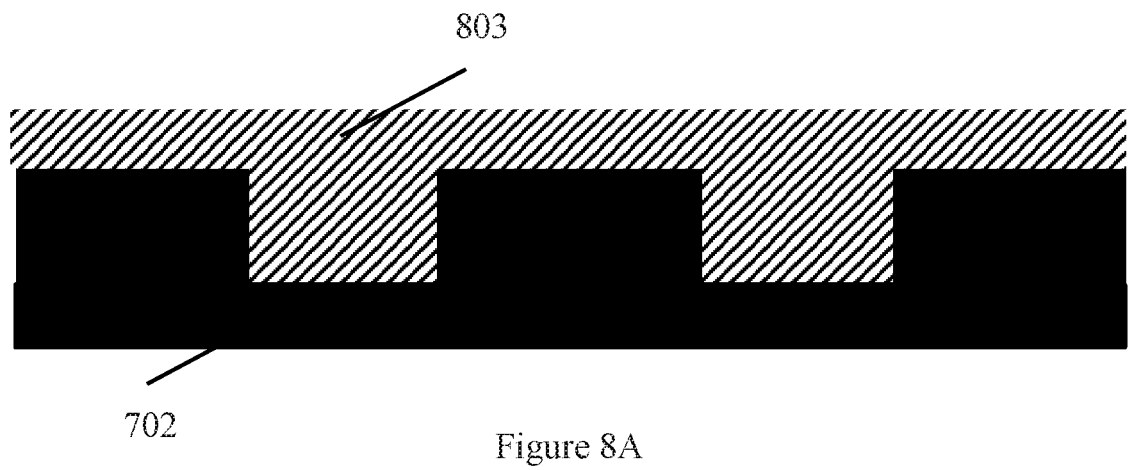
FIGS. 8A and 8B illustrate intermediate stages in the fabrication of a pcLED array by another variation of the phosphor deposition methods described herein.
Figure 8B:

Referring now to the partial cross-sectional views shown in FIG. 8A-8B, another variation of the phosphor deposition method uses an optionally reusable mold 702 as shown in FIG. 7A but overfills the mold with phosphor material 803 (FIG. 8A). As shown, in FIG. 8B, after removal from the mold this results in a monolithic phosphor structure comprising phosphor pixels 804 connected to each other by a phosphor material carrier 806. Carrier 806 plays a role similar to carrier 706 shown in FIG. 7C. Subsequent steps in forming the pcLED array in this variation of the method may generally track those described with respect to FIGS. 6D-6I.

In another variation of the phosphor deposition method, a checkerboard pattern as shown in FIG. 5 is formed by depositing a boron nitride grid on substrate 706. Such a boron nitride grid might be prepared by micromachining, for example. Alternatively, a frame formed from boron nitride, for example, may be attached to or brought in contact with the substrate 706.

Figure 7D:
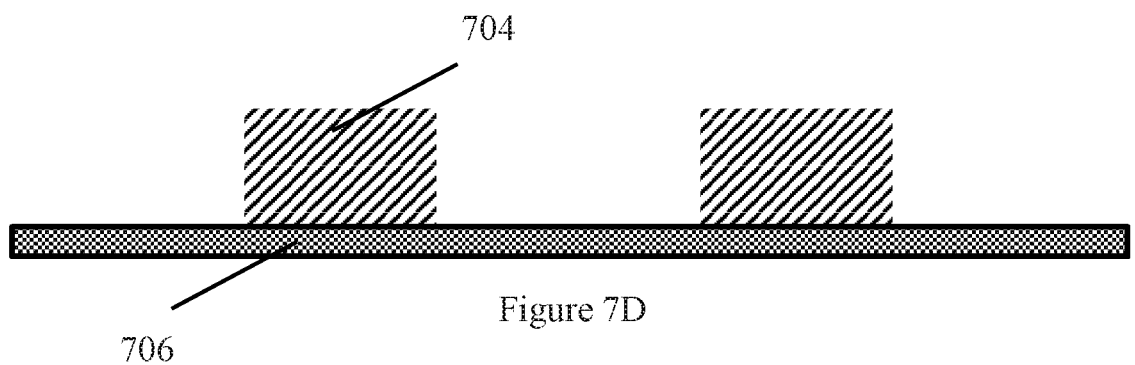

The frame or grid may be filled with phosphor material such as a PiG material followed by a high temperature curing step that leads to a phosphor pixel on substrate configuration as shown in FIG. 7D, after removal of the frame or grid. For the filling process a PiG material can be mixed with a liquid binder to obtain a paste or slurry. The paste or slurry can then be dosed into the openings of the frame or grid by methods such as casting or dispensing, for example, followed by steps of drying and removal of the binder additives. Subsequent steps in forming the pcLED array by these variations of the method may generally track those described with respect to FIGS. 6D-6I, with the boron nitride grid substituted for the photoresist pattern.

In variations in which a PiG material is deposited in a mold or frame, the mold or frame may be removed after glass melting and solidification at a temperature chosen to maintain the pixel shape while avoiding mechanical stress resulting from mismatches between the coefficients of thermal expansion of the mold or frame and the substrate, for example at the glass softening or annealing temperature.

Figure 9A:
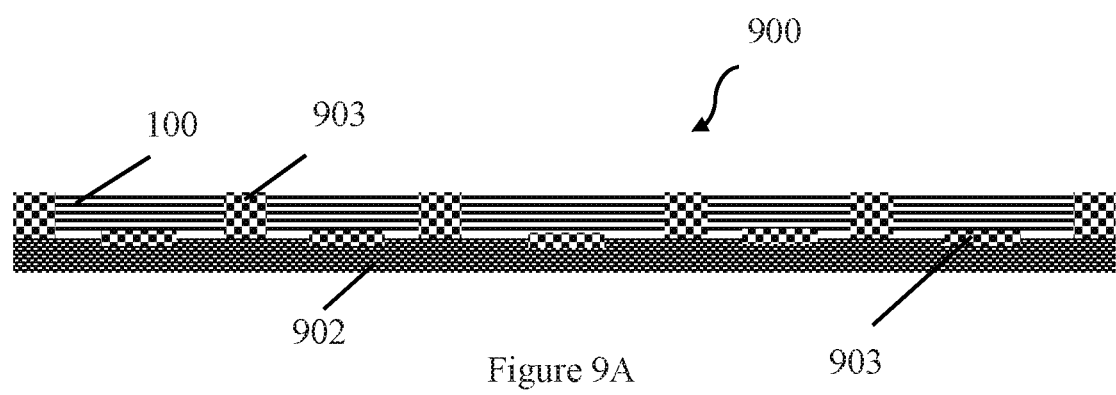
FIGS. 9A, 9B, 9C, 9D, and 9E illustrate intermediate stages in the fabrication of a pcLED array by another variation of the phosphor deposition methods described herein.

Referring now to the partial cross-sectional view of FIG. 9A, in another variation of the phosphor deposition method the phosphor material is deposited directly on an LED array 900. LED array 900 comprises LEDs 100 arranged on a substrate 902 in a rectangular array. Substrate 902 may comprise CMOS configured to drive the LEDs via interconnects and contacts 903.

Figure 9B:
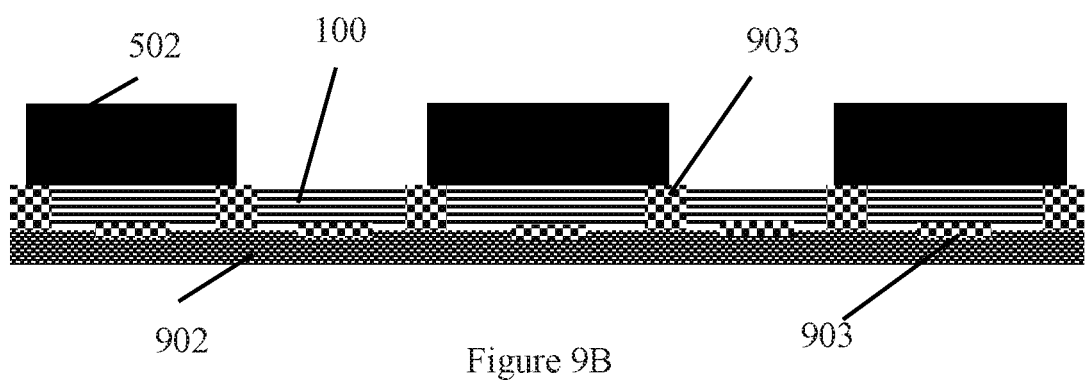

As shown in FIG. 9B, a checkerboard photoresist pattern 502 is deposited on LED array 900, overlying alternate LEDs. A passivating dielectric layer may be deposited on the LED array before deposition of the photoresist.

Figure 9C:
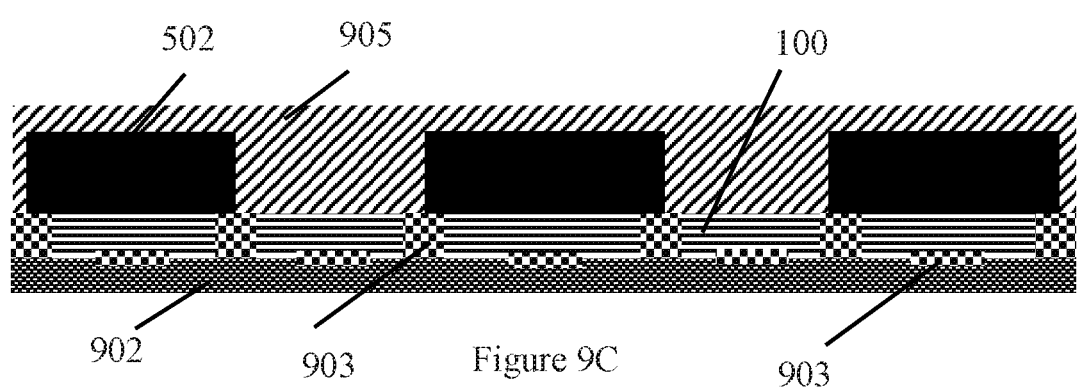
Figure 9D:
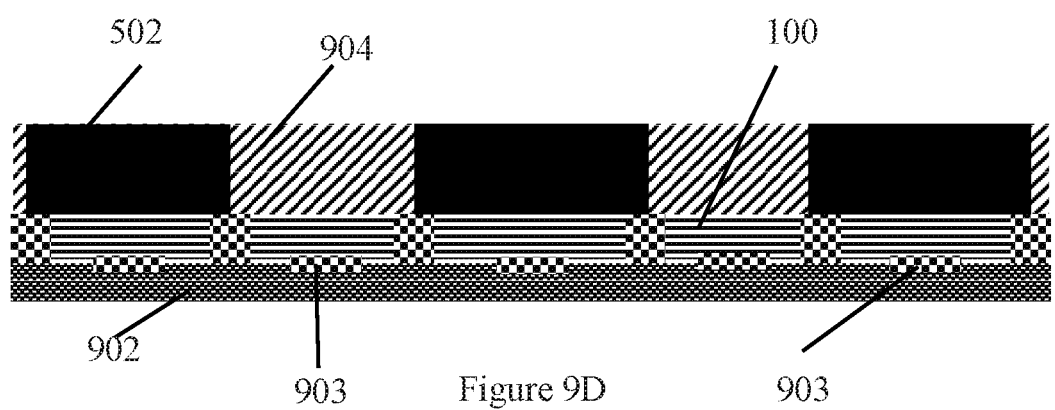
Figure 9E:
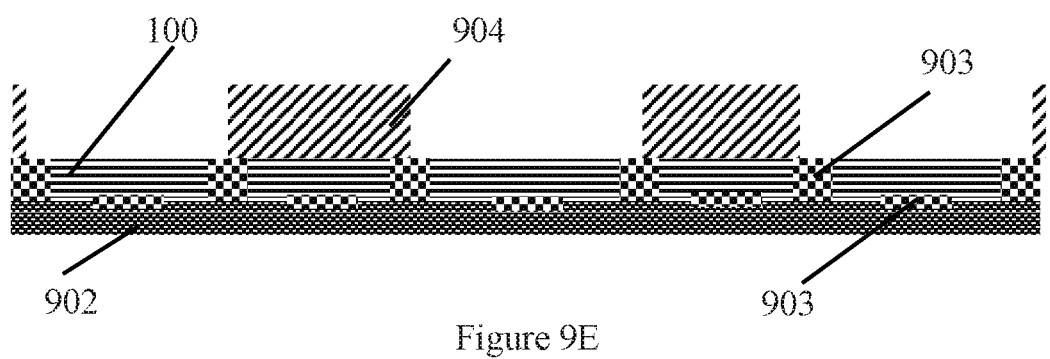

Subsequently, as shown in FIG. 9C a phosphor material 905 is deposited in the checkerboard photoresist pattern. Excess phosphor is removed from the top of the LED array, leaving phosphor pixels 604 in place over corresponding LEDs (FIG. 9D). The photoresist pattern may then be removed, similarly to as described for other variations of the method, resulting in the structure shown in FIG. 9E.

Subsequent steps in forming the pcLED array in this variation of the method may generally track those described with respect to FIGS. 6D-6I.

In variations of the phosphor deposition method employing a photoresist pattern 502 in combination with a phosphor material comprising phosphor particles dispersed in a silicone matrix, it is desirable to cure the silicone matrix at a temperature that satisfactorily cures the silicone but is sufficiently low to avoid baking or damaging the photoresist and making the photoresist difficult to remove.

Such low temperature curing may be facilitated, for example, by using a condensation cure silicone composition for the matrix, and curing it using vapor phase catalyzation. The condensation cure silicone composition may comprise organosiloxane block copolymers, for example. The vapor phase catalyst may be for example a basic or alkaline catalyzing agent. Superbase catalysts such as described in U.S. Pat. No. 9,688,035 by Swier et. al. can be used.

The term "superbase" used herein refers to compounds having a very high basicity, such as lithium diisopropylamide. The term "superbase" also encompasses bases resulting from a mixing of two (or more) bases leading to new basic species possessing inherent new properties. The term "superbase" does not necessarily mean a base that is thermodynamically and/or kinetically stronger than another. Instead, in some variations it means that a basic reagent is created by combining the characteristics of several different bases. The term "superbase" also encompasses any species with a higher absolute proton affinity (APA=245.3 kcal/mole) and intrinsic gas phase basicity (GB=239 kcal/mole) relative to 1,8-bis-(dimethylamino)-naphthalene. Non-limiting examples of superbases include organic superbases, organometallic superbases, and inorganic superbases.

Organic superbases include but are not limited to nitrogen-containing compounds. In some embodiments, the nitrogen-containing compounds also have low nucleophilicity and relatively mild conditions of use. Non-limiting examples of nitrogen-containing compounds include phosphazenes, amidines, guanidines, and multicyclic polyamines. Organic superbases also include compounds where a reactive metal has been exchanged for a hydrogen on a heteroatom, such as oxygen (unstabilized alkoxides) or nitrogen (metal amides such as lithium diisopropylamide). In some embodiments, the superbase catalyst is an amidine compound. In some embodiments, the term "superbase" refers to organic superbases having at least two nitrogen atoms and a pKb of from about 0.5 to about 11, as measured in water.

Organometallic superbases include, but are not limited to, organolithium and organomagnesium (Grignard reagent) compounds. In some variations, the organometallic superbases are hindered to the extent necessary to make them non-nucleophilic.

Superbases also include mixtures of organic, organometallic, and/or inorganic superbases. A non-limited example of such mixed superbases is the Schlosser base (or Lochmann-Schlosser base), which is the combination of n-butyllithium and potassium tert-butoxide. The combination of n-butyllithium and potassium tert-butoxide form a mixed aggregate of greater reactivity than either reagent alone and with distinctly different properties in comparison to tert-butylpotassium.

Inorganic superbases include salt-like compounds with small, highly charged anions. Non-limiting examples of inorganic superbases include lithium nitride and alkali- and alkali earth metal hydrides including potassium hydride and sodium hydride. Such species are insoluble in all solvents owing to the strong cation-anion interactions, but the surfaces of these materials are highly reactive and slurries can be used.

In some variations the superbase catalyst comprises 1,8-Diazabicyclo[5.4.0]undec-7-ene (DBU), (CAS #6674-22-2)

The amount of the superbase catalyst used can vary and is not limiting. Typically, the amount added through vapor phase is a catalytically effective amount, which may vary depending on the superbase selected, and vapor permeation properties of the siloxane polymer resin. The amount of superbase catalyst is typically measured in parts per million (ppm) in the solid composition. In particular, the catalyst level is calculated in regard to copolymer solids. The amount of superbase catalyst added to the curable silicone compositions may range from 0.1 to 1,000 ppm, alternatively from 1 to 500 ppm, or alternatively from 10 to 100 ppm, as based on the polymer resin content (by weight) present in the solid compositions.

The silicone material or siloxanes can be selected for mechanical stability, low temperature cure properties (e.g. below 150-120 degrees Celsius), and ability to be catalyzed using vapor phase catalysts. In some variations, organosiloxane block copolymers can be used. Organopolysiloxanes containing D and T units, where the D unit are primarily bonded together to form linear blocks having 10 to 400 D units and the T units are primarily bonded to each other to form branched polymeric chains, which are referred to as "non-linear blocks" can be used.

This disclosure is illustrative and not limiting. Further modifications will be apparent to one skilled in the art in light of this disclosure and are intended to fall within the scope of the appended claims.

The invention claimed is:

1. A method of fabricating a matrix array of phosphor-converted LEDs, the method comprising:
    in a first phosphor deposition step depositing a phosphor material at alternating locations in a matrix array to form a checkerboard pattern of phosphor pixels in which locations in the matrix array at which phosphor pixels are deposited alternate with locations in the array at which phosphor pixels are not deposited, the phosphor pixels comprising side walls adjacent to and facing the locations in the array at which phosphor pixels are not deposited;
    depositing reflective structures on the side walls of the phosphor pixels deposited in the first phosphor deposition step; and
    in a second phosphor deposition step, after depositing the reflective structures, depositing a phosphor material to form phosphor pixels at the alternating locations in the matrix array at which phosphor pixels were not deposited in the first phosphor deposition step, such that after the first and second phosphor deposition steps adjacent phosphor pixels in the resulting matrix array of phosphor pixels are in contact with and spaced apart by one of the reflective structures.

2. The method of claim 1, in which the phosphor pixels are spaced apart by less than or equal to about 10 microns by the reflective structures.

3. The method of claim 1, in which the phosphor pixels are spaced apart by less than or equal to about 3 microns by the reflective structures.

4. The method of claim 1, wherein depositing reflective structures on the side walls of the phosphor pixels deposited in the first phosphor deposition step comprises also depositing reflective structures on other surfaces of the matrix array of phosphor-converted LEDs, comprising removing reflective structures from at least some of those other surfaces after the second phosphor deposition step.

5. The method of claim 1, wherein the phosphor material deposited in the second phosphor deposition step is the same as the phosphor material deposited in the first phosphor deposition step.

6. The method of claim 1, wherein the phosphor material deposited in the second phosphor deposition step differs from the phosphor material deposited in the first phosphor deposition step.

7. The method of claim 1, comprising forming the matrix array of phosphor pixels on a carrier, and transferring the matrix array of phosphor pixels from the carrier to a matrix array of LEDs to form the matrix array of phosphor-converted LEDs.

8. The method of claim 1, comprising forming the matrix array of phosphor pixels directly on a matrix array of LEDs to form the matrix array of phosphor-converted LEDs.

9. The method of claim 1, comprising in the first phosphor deposition step depositing the phosphor material in openings in a photoresist structure to form the checkerboard pattern of phosphor pixels.

10. The method of claim 9, comprising removing the photoresist structure before depositing the reflective structures.

11. The method of claim 10, comprising:
    forming the photoresist structure on a carrier; and
    subsequently transferring the matrix array of phosphor pixels from the carrier to a matrix array of LEDs to form the matrix array of phosphor-converted LEDs.

12. The method of claim 10, comprising forming the photoresist structure on an array of LEDs.

13. The method of claim 1, comprising in the first phosphor deposition step depositing the phosphor material in openings in a mold to form the checkerboard pattern of phosphor pixels.

14. The method of claim 13, wherein the phosphor material deposited in the first phosphor deposition step comprises a phosphor in a glass matrix.

15. The method of claim 14, wherein the mold is formed from boron nitride.

16. The method of claim 13, comprising;
transferring the checkerboard pattern of phosphor pixels from the mold to a carrier before depositing the reflective structures; and
subsequently transferring the matrix array of phosphor pixels from the carrier to a matrix array of LEDs to form the matrix array of phosphor-converted LEDs.

17. The method of claim 1, wherein the reflective structures comprise scattering particles dispersed in a matrix.

18. The method of claim 1, wherein the reflective structures comprise reflective metal layers.

19. The method of claim 1, wherein the reflective structures comprise Distributed Bragg Reflector structures.

20. The method of claim 1, wherein, in the second phosphor deposition step, depositing a phosphor material to form phosphor pixels comprises depositing a phosphor material to form phosphor pixels each having a width matching a distance between adjacent reflective structures on the side walls of the phosphor pixel deposited in the first phosphor deposition step.

\* \* \* \* \*